US007619476B2

(12) United States Patent
Harman

(10) Patent No.: US 7,619,476 B2
(45) Date of Patent: Nov. 17, 2009

(54) BIASING STAGE FOR AN AMPLIFIER

(75) Inventor: Jefferson H. Harman, Tucson, AZ (US)

(73) Assignee: Cirrus Logic, Inc., Austin, TX (US)

( * ) Notice: Subject to any disclaimer, the term of this patent is extended or adjusted under 35 U.S.C. 154(b) by 280 days.

(21) Appl. No.: 11/378,029

(22) Filed: Mar. 15, 2006

(65) Prior Publication Data

US 2006/0208800 A1 Sep. 21, 2006

Related U.S. Application Data

(60) Provisional application No. 60/661,751, filed on Mar. 15, 2005.

(51) Int. Cl.
*H03F 3/26* (2006.01)

(52) U.S. Cl. ........................ 330/267; 330/264; 330/266

(58) Field of Classification Search ................. 330/118, 330/263, 264, 266, 267, 300
See application file for complete search history.

(56) References Cited

U.S. PATENT DOCUMENTS 4,031,482 A * 6/1977 Tsurushima ................ 330/264
4,638,260 A * 1/1987 Hamley ...................... 330/254
5,475,343 A * 12/1995 Bee ............................ 330/255
5,815,040 A * 9/1998 Barbetta ..................... 330/264
6,144,256 A * 11/2000 Barbetta ..................... 330/255
6,154,094 A * 11/2000 Seven .......................... 330/252
6,194,968 B1 * 2/2001 Winslow ..................... 330/289
6,268,770 B1 * 7/2001 Barbetta ..................... 330/264
6,414,549 B1 * 7/2002 Barbetta ..................... 330/264
6,424,220 B2 * 7/2002 Komuro ..................... 330/267
6,646,508 B1 * 11/2003 Barbetta ..................... 330/264
6,781,417 B1 * 8/2004 Le et al. ....................... 326/83
6,784,739 B2 * 8/2004 Reffay et al. ................ 330/264

* cited by examiner

*Primary Examiner*—Khanh V Nguyen
(74) *Attorney, Agent, or Firm*—Hayes Soloway P.C.

(57) ABSTRACT

An amplifier biasing stage includes a transistor that provides a biasing signal for a complementary pair of field-effect transistors included in an output stage of an amplifier. The amplifier biasing stage also includes one resistive element connected to an emitter of the transistor, another resistive element connected to a base of the transistor, and still another resistive element connected to a collector of the transistor. The respective resistances of the resistive elements are selected to substantially match a voltage provided by the amplifier biasing stage to a gate-to-source voltage of the complementary pair of field-effect transistors. The resistances of the resistive elements are also selected to substantially match a temperature coefficient of the amplifier biasing stage to a temperature coefficient of the complimentary pair of field-effect transistors.

19 Claims, 10 Drawing Sheets

BIASING STAGE FOR AN AMPLIFIER

RELATED APPLICATION AND TECHNICAL FIELD

This application is related to the following U.S. application, of common assignee, from which priority is claimed, and the contents of which are incorporated herein in their entirety by reference: "Tailored $V_{BE}$ Multiplier," U.S. Provisional Patent Application Ser. No. 60/661,751, filed Mar. 15, 2005.

This disclosure relates to amplifier biasing stages and, more particularly, to a biasing stage for an amplifier output stage.

BACKGROUND

Amplifiers such as operational amplifiers may be used in many electronic circuits to condition, manipulate and amplify signals. In general, an operational amplifier may be designed so that an output signal is proportional to the difference between two input signals. The operating characteristics of an operational amplifier are typically dependent upon its circuit topology. For example, an operational amplifier may include a number of stages such as an output stage that conditions output signals based on the characteristics the output stage and other stages.

While output stage designs may implement various components, field-effect transistors (FETs) such as metal-oxide semiconductor field-effect transistors (MOSFETs) are often incorporated into designs due to their robustness and relatively large operating ranges. To provide amplifiers with low output impedance, FETs may be incorporated into output stage designs in source-follower amplifier configurations. However, compared to bipolar junction transistors (BJTs), the threshold voltage of FETs may vary by significant amounts. These threshold variations may even be present across FETs that are within the same family of devices. In addition to large threshold voltage variations, FETs characteristically have large variations in their temperature coefficients. In general, the temperature coefficient of a FET quantifies the average output voltage change of the FET as a function of ambient temperature. By accounting for variations in temperature coefficient, the performance of an output stage of an amplifier may be improved along with reducing design complexity and production cost.

SUMMARY OF THE DISCLOSURE

In one implementation, an amplifier biasing stage includes a transistor that provides a biasing signal for a complementary pair of field-effect transistors included in an output stage of an amplifier. The amplifier biasing stage also includes one resistive element connected to an emitter of the transistor, another resistive element connected to a base of the transistor, and still another resistive element connected to a collector of the transistor. The respective resistances of the resistive elements are selected to substantially match a voltage provided by the amplifier biasing stage to a gate-to-source voltage of the complementary pair of field-effect transistors. The respective resistances of the resistive elements are also selected to substantially match a temperature coefficient of the amplifier biasing stage to a temperature coefficient of the complimentary pair of field-effect transistors.

One or more of the following features may be included. The transistor may be a bipolar junction transistor. The resistance of one resistive element may be based, at least in part, on a predefined temperature coefficient. The output stage may be configured as a source-follower output stage, a common-source output stage, or as a class AB output stage. The transistor may be an NPN or a PNP bipolar junction transistor.

In another implementation, an amplifier biasing stage includes a transistor that provides a biasing signal for a complementary pair of field-effect transistors included in an output stage of an amplifier. The amplifier biasing stage also includes one resistive element connected to a source of the transistor, another resistive element connected to a gate of the transistor, and still another resistive element connected to a drain of the transistor. The respective resistances of the resistive elements are selected to substantially match a voltage provided by the amplifier biasing stage to a gate-to-source voltage of the complementary pair of field-effect transistors. The respective resistances of the resistive element are also selected to substantially match a temperature coefficient of the amplifier biasing stage to a temperature coefficient of the complimentary pair of field-effect transistors.

One or more of the following features may be included. The transistor may be a field-effect transistor such as a P-channel field-effect transistor or an N-channel field-effect transistor.

In another implementation, an apparatus includes an integrated circuit. The integrated circuit includes an amplifier. The amplifier includes an output stage that provides an amplified version of an input signal. The amplifier also includes a gain stage that drives the output stage. The amplifier also includes a biasing stage that biases the output stage. The biasing stage includes a transistor that provides a biasing signal for a complementary pair of field-effect transistors included in an output stage. The biasing stage also includes one resistive element connected to an emitter of the transistor, another resistive element connected to a base of the transistor, and still another resistive element connected to a collector of the transistor. The respective resistances of the resistive elements are selected to substantially match a voltage provided by the biasing stage to a gate-to-source voltage of the complementary pair of field-effect transistors. The respective resistances are also selected to substantially match a temperature coefficient of the biasing stage to a temperature coefficient of the complementary pair of field-effect transistors.

One or more of the following features may be included. The transistor may be a bipolar junction transistor. The output stage may be configured as a source-follower output stage, a common-source output stage, or as a class AB output stage.

A method includes a biasing stage, which includes a transistor, biasing a complementary pair of field-effect transistors included in an output stage of an amplifier. An emitter of the transistor is connected to one resistive element. Abase of the transistor is connected to another resistive element, and a collector of the transistor is connected to still another resistive element. The respective resistances of the resistive elements are selected to substantially match a voltage provided by the biasing stage to a gate-to-source voltage of the complementary pair of field-effect transistors. The respective resistances of the resistive elements are also selected to substantially match a temperature coefficient of the biasing stage to a temperature coefficient of the complimentary pair of field-effect transistors.

One or more of the following features may be included. The method may further include driving the output stage with a gain stage.

Additional advantages and aspects of the present disclosure will become readily apparent to those skilled in the art from the following detailed description, wherein embodiments of the present invention are shown and described, simply by way of illustration of the best mode contemplated for practicing the present invention. As will be described, the present disclosure is capable of other and different embodiments, and its several details are susceptible of modification in various obvious respects, all without departing from the spirit of the present disclosure. Accordingly, the drawings and description are to be regarded as illustrative in nature, and not as limitative.

DETAILED DESCRIPTION OF THE EMBODIMENTS

Figure 1:
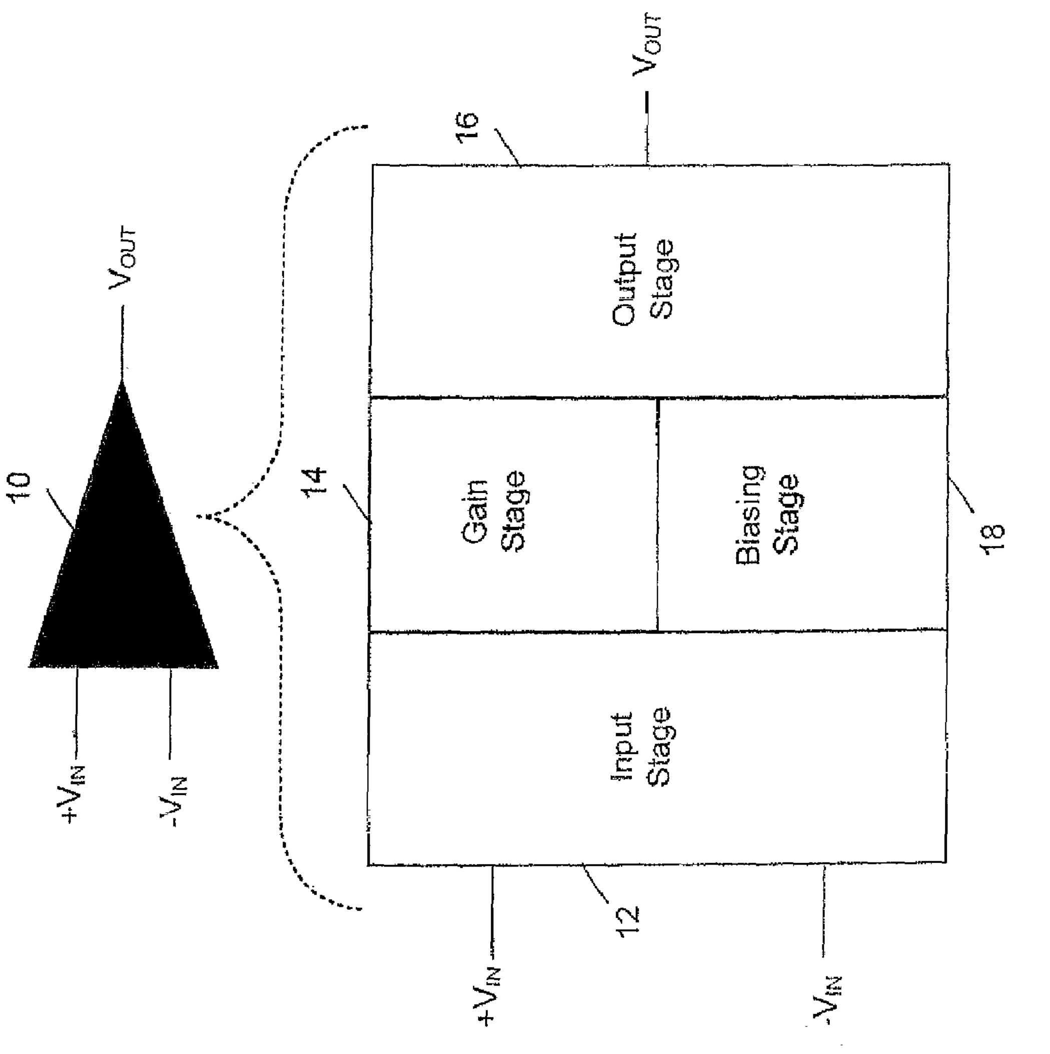
FIG. 1 is a block diagram representing stages of an operational amplifier.

Referring to FIG. 1, a graphical representation of an operation amplifier 10 is shown that may include two input ports capable of respectively receiving a high (labeled $+V_{IN}$) and low (labeled $-V_{IN}$) portions of an input signal. As is known in the art of electronic components, these input ports may be referred to as the inverting and non-inverting inputs of the operational amplifier. Operational amplifier 10 may also include an output port (labeled $V_{OUT}$) that may provide an output signal that may be an amplified version of the difference of the $+V_{IN}$ and $-V_{IN}$ signals present on the two input ports. To amplify this differential signal, which may include applying a relatively high voltage gain, operational amplifier 10 may include numerous stages. Some of these stages are represented in the figure. For example, operational amplifier 10 may include an input stage 12 that receives signals from the two input ports and conditions the signals for amplification. Operation amplifier 10 may include a gain stage 14 that may apply a relatively high voltage gain to the differential signal present on the inputs. In some designs this amplified difference signal may be provided by gain stage 14 to an output stage 16 that may condition and provide the signal ($V_{OUT}$) to the output port.

Various types of output stages may be implemented in operational amplifier 10. For example, a class A output stage may be implemented to provide substantially linear amplification and reduced distortion levels. Class B output stages may also be implemented that may increase amplifier efficiency (compared to class A), however, distortion levels may increase. In another exemplary design, a class AB output stage may be implemented that may provide moderate efficiency and reduced distortion levels due to a biasing signal (e.g., a bias current) that may be provided to the output stage. In this particular design, operational amplifier 10 may include a biasing stage 18 that may provide a bias signal to output stage 16. As described in detail below, various techniques may be used by biasing stage 18 to provide one or more biasing signals to output stage 16. As with most circuitry designs, a need may be present to reduce production cost and simplify stage design.

Figure 2:
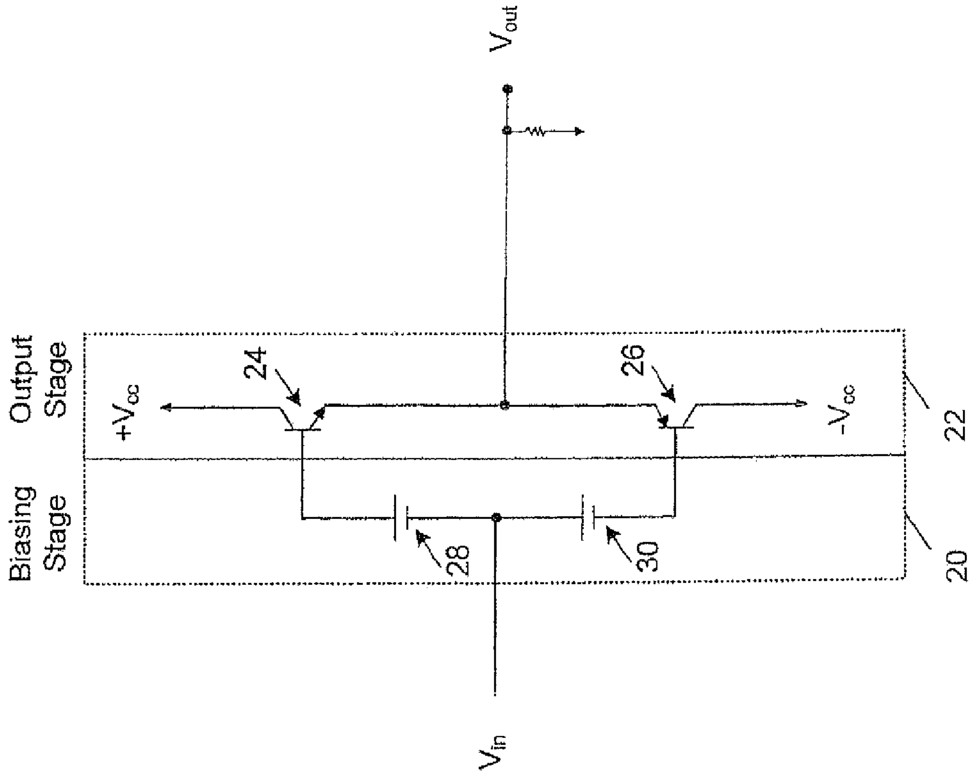
FIG. 2 is a circuit diagram that demonstrates biasing an output stage of the operation amplifier shown in FIG. 1.

Referring to FIG. 2, a biasing stage 20 and an output stage 22 may be used for demonstrating a conventional biasing technique. In this example, biasing stage 20 may provide a biasing signal to output stage 22, which may be configured as an AB class output stage. To substantially reduce distortion, relatively small biasing current signals may be provided to output stage 22. In particular, the biasing current signals may be used to bias a pair of complementary bipolar junction transistors (BJT) 24 and 26 that may be included in output stage 22. To represent the application of the biasing current signals, two voltage sources 28 and 30 (e.g., batteries) may be respectively connected to the bases of BJT 24 and 26. By biasing the bases of these complementary BJTs, the transistors may be held in a "slightly on" state and thereby substantially reduce distortion that may be caused by increasing and decreasing of the biasing level provided by $V_{in}$.

In this particular design, BJTs 24, 26 may be implemented in output stage 22 to condition output signals. However, in other designs, different semiconductor devices may be implemented individually or in combination with BJTs for an output stage. For example, field-effect transistors (FETs) such as metal-oxide semiconductor field-effect transistors (MOSFETs) may be included in an output stage for conditioning output signals. Due to robust characteristics, MOSFETs may provide a relatively large operating range while being implemented as a complementary pair (similar to BJT 24 and 26). Additionally, to provide low output impedance, which may be desirable for an operational amplifier, the output stage may implement an emitter-follower or source-follower design.

Rather than using two voltage sources to provide biasing signals, other biasing techniques may be implemented. For example a BJT-based circuit may be included in a biasing stage that may provide biasing signals to the complementary transistor pair (e.g., BJTs, FETs, etc.) in the output stage. One BJT-based circuit, known as a $V_{BE}$ multiplier, may be used for biasing situations in which the output voltage of the output stage may need to vary with temperature in a relatively predictable manner. Output voltage change as a function of ambient temperature change (that may be expressed as a percent per degree centigrade) may be defined as the temperature coefficient of a transistor or other type of circuit element.

In some conventional circuits the bias voltages may be provided by implementing various types of component networks. For example, resistor networks, diode and resistor networks, transistor (e.g., connected to produce a diode) and resistor networks, or networks that include other types of discrete (or hybrid) components may be implemented. Similarly, a network that implements a conventional $V_{BE}$ multiplier may provide the bias voltages.

Referring to the figure, various components may be used to provide the bias voltages of voltage sources 28 and 30. For example, since the voltage across a forward-biased silicon diode may match the base-to-emitter voltage of a silicon transistor (e.g., transistor 24, transistor 26, etc.) and may have a similar temperature coefficient, a diode may replace either voltage source. Similarly a transistor connected to function as a diode may replace voltage source 28 or 30. In particular, a transistor that may be similar to the transistor type used in output stage 22 may provide a relatively close match to the base-to-emitter voltage and temperature coefficient of the respective output stage transistors.

In this biasing arrangement, the voltage across a silicon diode or base-to-emitter junction may be a function of the current through the diode or the emitter of the transistor. Thereby, the current through output stage 22 may be nearly equivalent to the current through the biasing network. However, if a larger current may be needed to flow through output stage 22 (compared to the current flow in biasing stage 20), a $V_{BE}$ multiplier may be implemented in biasing stage 20. By using a $V_{BE}$ multiplier, a flexible bias voltage may be provided over a continuous range that may be greater than the base-to-emitter voltage of the transistor included in the $V_{BE}$ multiplier. For example, a bias voltage of 1.54 volt may be provided from a $V_{BE}$ multiplier that includes a transistor that may have a base-to-emitter voltage of 650 milli-volt. Such a $V_{BE}$ multiplier may provide 100 milli-amperes with a bias stage current of 1 milli-ampere. Additionally, the temperature coefficient of the $V_{BE}$ multiplier may be multiplied by the ratio of this voltage increase and may provide temperature tracking.

Figure 3:
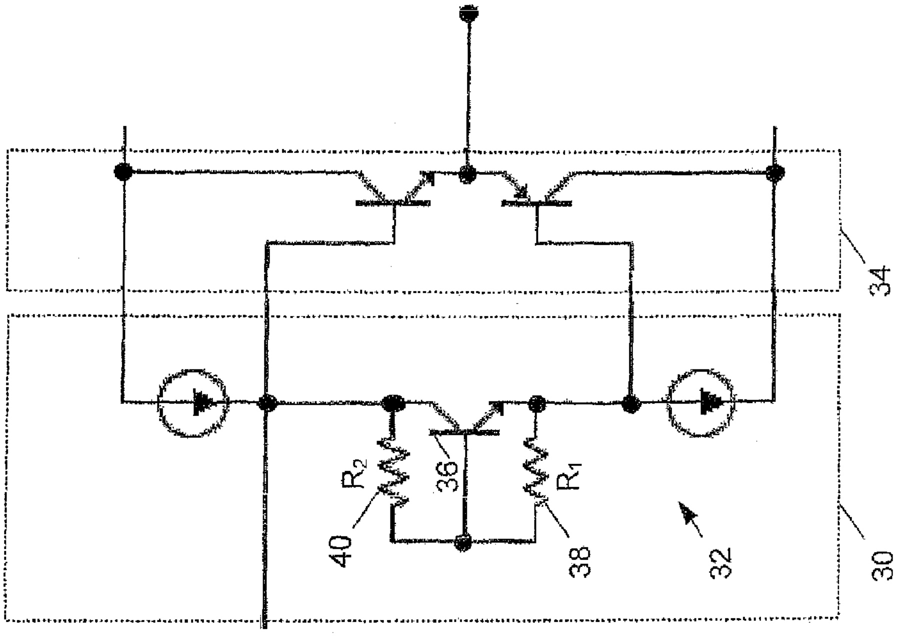
FIG. 3 is a circuit diagram of a conventional $V_{BE}$ multiplier that may be used to bias an emitter follower output stage.

Referring to FIG. 3, a bias stage 30 may include a circuit that implements an exemplary $V_{BE}$ multiplier 32 for biasing an output stage 34. In this arrangement, voltage across the collector-to-emitter of a transistor 36 may be attenuated by a voltage divider produced by resistors 38 ($R_1$) and 40 ($R_2$). Since the base of transistor 36 may provide a negative feedback input of the transistor, the base-to-emitter voltage of transistor 36 may be substantially equivalent to the attenuated collector-to-emitter voltage. Since the base-to-emitter voltage may be defined by the current through the emitter, the feedback provided by the voltage divider may defines the collector-to-emitter voltage as:

$$\frac{R_1 + R_2}{R_1} V_{BE}.$$

Along with providing a factor for multiplying $V_{BE}$, the factor of $(R_1+R_2)/R_1$ also scales other quantities such as temperature coefficient.

Similar to a $V_{BE}$ multiplier, a MOSFET-based circuit (a $V_{GS}$ multiplier), may be implemented for biasing a pair of complementary MOSFETs included in an output stage. However, rather than multiplying a base-to-emitter voltage ($V_{BE}$), a gate-to-source voltage ($V_{GS}$) may be provided as a multiplication factor. Operational characteristics of MOSFETs may vary by significant amounts. For example, the gate-to-source threshold voltage may vary significantly among MOSFETs of the same type. For example, threshold voltage may vary with a ratio of 2:1 or more for FETs of the same type. In addition to threshold voltage variations, temperature coefficient may significantly vary among MOSFETs across different MOSFET families. Thus, characteristics of MOSFETs included in a biasing stage of an operational amplifier may not match the characteristics of MOSFETs included in the output stage of the operational amplifier.

In contrast to MOSFETs, the base-to-emitter voltage of BJTs may be relatively stable among devices in the same families and across different device families. For example, a factor of 2.0 mV/° C. may be used to model the temperature coefficient of a BJT. Furthermore, the base-to-emitter voltage ($V_{BE}$) may only vary by 10% for BJTs of the same type and operating at the same current level.

Due to relatively stable temperature coefficients and base-to-emitter threshold voltages, $V_{BE}$ multipliers may be implemented into biasing stages for matching the characteristics of MOSFETs included in an output stage of an operational amplifier. Furthermore, since BJTs may be inexpensive (compared to MOSFETs), incorporating BJTs into a biasing stage may reduce production costs. However, the temperature coefficient provided by MOSFETs in the output stage may not be equivalent to the temperature coefficient of a conventional $V_{BE}$ multiplier. Thus a conventional $V_{BE}$ multiplier may not match the temperature coefficient of an output stage that includes a complementary pair of MOSFETs.

Figure 4:
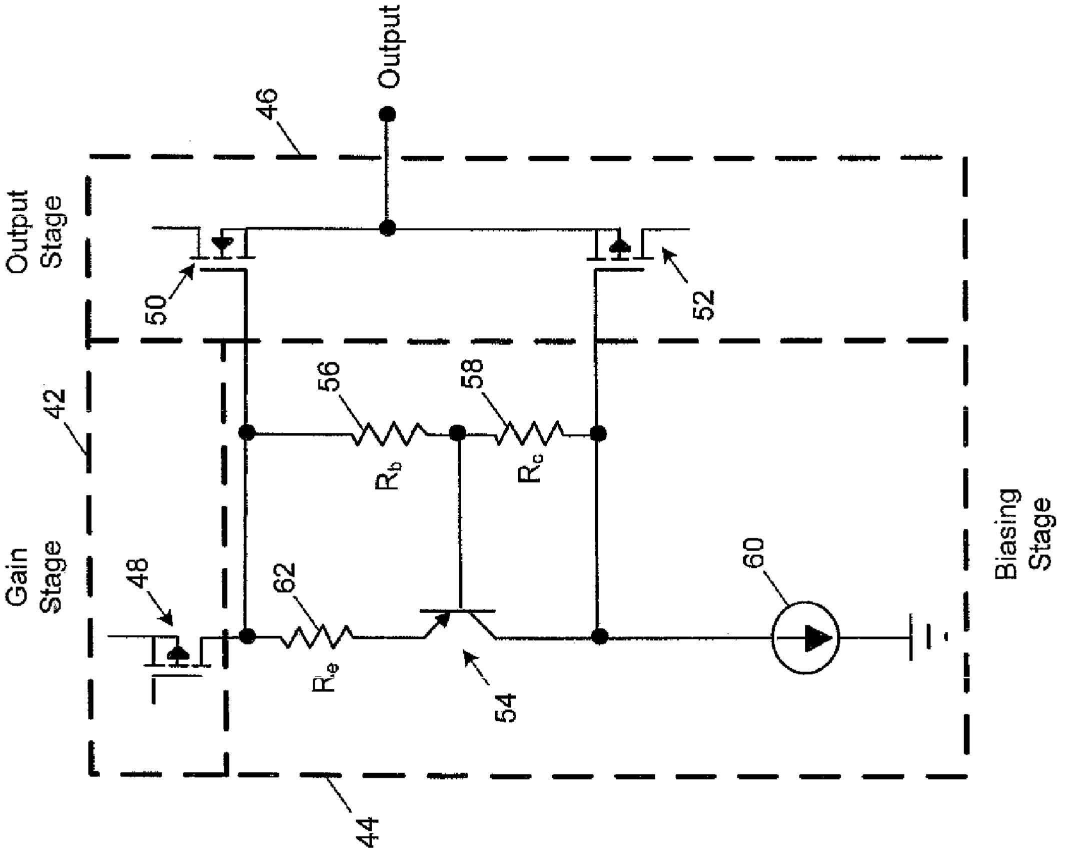
FIG. 4 is a circuit diagram of a biasing stage that may substantially match the temperature coefficient and threshold voltage of FETs included in an output stage of an operational amplifier.

Referring to FIG. 4, a $V_{BE}$ multiplier may be incorporated into a biasing stage of an operational amplifier to provide biasing signals to MOSFETs included in an output stage of the operational amplifier. In particular, components may be included in the $V_{BE}$ multiplier biasing stage to substantially match characteristics of the output stage MOSFETs (e.g., threshold voltages and temperature coefficients). In this exemplary design, portions of a gain stage 42, a biasing stage 44, and an output stage 46 of an operational amplifier are shown. Gain stage 42 may include a MOSFET 48 that may drive a complementary pair of MOSFETs 50, 52 (configured as source-followers) that may be included in output stage 46. The $V_{BE}$ multiplier included in biasing stage 44 may be implemented with a BJT 54 of PNP type (e.g., a bipolar transistor having an n-type base between a p-type emitter and a p-type collector). A pair of resistors 56 and 58 (respectively labeled $R_b$ and $R_c$) may be connected to the base of BJT 54 and each resistor may have a resistance for producing a biasing signal that may be provided across the gates of MOSFETs 50 and 52. Additionally, biasing stage 44 may include a current source 60 the may define the biasing signal. While current source 60 may be represented in the figure with a schematic symbol, it is understood that the source may be implemented with various types of current source designs known to one skilled in the art of circuit design and fabrication.

As mentioned above, by using a $V_{BE}$ multiplier to bias the complementary pair of MOSFETs (i.e., MOSFETs 50 and 52) in output stage 46, the gate-to-source voltage ($V_{GS}$) of the MOSFETs may be substantially matched by biasing stage 44. However, along with matching $V_{GS}$, the temperature coefficient (which may be proportional to $V_{GS}$) of MOSFETs 50, 52 may also be matched by the $V_{BE}$ multiplier in biasing stage 44. To substantially match the temperature coefficients of the complementary pair of MOSFETs in output stage 46, the $V_{BE}$ multiplier implemented in biasing stage 44 may also include a resistor 62 (labeled $R_e$) that may be connected in series with the emitter of BJT 54. By selecting appropriate resistances for resistors 56, 58 and 62, the temperature coefficient and $V_{GS}$ of the output stage MOSFETs may be substantially matched by biasing stage 44. The resistance may be selected such that the ratio of the temperature coefficient and bias voltage provided by the $V_{BE}$ multiplier may be adjusted to substantially match $V_{GS}$ and the temperature coefficient of $V_{GS}$ for the complementary pair of MOSFETs 40, 42. Furthermore, resistances may be selected such that the resistance of one resistor (e.g., resistor 58) may be adjusted to trim the biasing voltage while substantially maintaining the match between the temperature coefficient of that voltage and the temperature coefficient of $V_{GS}$. Thus, both the temperature coefficient and $V_{GS}$ may be matched, for example, by making only one adjustment.

In this exemplary design, a single discrete component (i.e., resistor 62) may be used to connect a resistance to the emitter of BJT 54. However, in some arrangements, the resistance may be provided by one or more other types of resistive elements. For example, one or more other types of discrete components (e.g., transistors, diodes, etc.) or hybrid circuits may be used to provide the resistance represented by resistor 62.

The appropriate resistances for resistors 56 ($R_b$), 58 ($R_c$) and 62 ($R_e$) may be determined analytically and/or by computational methods (e.g., circuit analysis software or a programming package). By choosing an appropriate resistance values, two ratios may be tailored to meet the needs of the source-followers produced by MOSFETs 50 and 52. In particular, the ratio of the voltage across the base resistor 56 ($R_b$) to the voltage across the resistors 46 and 58 (i.e., the voltage provided by biasing stage 44) may be determined by analyzing the voltage divider in the base network. Additionally, the ratio of the change of voltage at the base of BJT 54 to the change in voltage across resistors 56 and 58 may be represented as the closed loop gain of biasing stage 44. While, the resistances of resistors 56, 58 and 62 may be adjusted for substantially matching the temperature coefficient of MOSFETs 50 and 52, the temperature coefficient of biasing stage 44 is constrained. In particular, the temperature coefficient of biasing stage 44 may only be lowered from an amount equivalent to the temperature coefficient of the circuit if resistor 62 is absent in the emitter leg of BJT 54.

To determine the resistance values of resistor 56 ($R_b$), resistor 58 ($R_c$) and resistor 62 ($R_e$), the following analysis may be implemented. To perform the analysis, the current gain $h_{FE}$ (ratio of output current to input current) may be considered relatively large and the output conductance $h_{oe}$ of biasing stage 44 may be considered relatively low so that both quantities may be removed from the analysis. Additionally, in this exemplary exercise, a value of $V_{BE}$ for BJT 44 may be set by the transistor specifications for an ambient temperature of 25° C. and 1 milli-ampere emitter current. For example, a typical value of $V_{BE}$ may be 650 milli-volt for a general purpose silicon transistor (e.g., a 2N2907 transistor) and $V_{BE}$ may vary 60 milli-volt per decade of current (in milli-amperes) through the emitter.

Using these specifications, with $I_e$ expressed in mA:

$$V_{BE}=650\text{ mV}+\log_{10}(I_e)(60\text{ mV})$$

In general, the temperature coefficient for a silicon BJT may be approximately 2.3 mV/° C. Additionally, the internal emitter resistance of the BJT may be represented as $26/I_e$ in which $I_e$ is in units of mA.

The current provided by current source 50 may be defined based on drive considerations. For example, by selecting a current ratio of 1:1 for current though the components connected in series, low circuit sensitivity to current variation may be provided.

For this analysis define:

V=Voltage across biasing circuit 34

$V_b$=Voltage across $R_b$ 56

TC=desired temperature coefficient in mV/° C.

$I=I_{Current\ Source}/2$ $K=V/V_b$ $K_T$=TC/2.3 mV/° C.

$r_e$=internal emitter resistance of BJT 54

Again, assuming $h_{FE}$ may be relatively high and $h_{oe}$ may be relatively low, the open loop gain may be represented as:

$$A_{OL}=(R_b+R_c)/(r_e+R_e)$$

In general, feedback may be represented as:

$$A=A_{OL}/(1+A_{OL}\beta)$$

Using this representation, for biasing stage 34, the feedback may be represented by inspection as:

$$\beta=R_b/(R_b+R_c)$$

Substituting for β in the previous representation for feedback:

$$A=\frac{(R_b+R_c)/(r_e+R_e)}{1+((R_b+R_c)/(r_e+R_e))*(R_b/(R_b+R_c))}.$$

Simplifying this expression:

$$A=\frac{(R_b+R_c)/(r_e+R_e)}{(r_e+R_e+R_b)/(r_e+R_e)}$$

$$A=(R_b+R_c)/(r_e+R_e+R_b)$$

$K_T$ may be the ratio of the desired TC to 2.3 mV/° C. and may be equivalent to A, thereby:

$$K_T=(R_b+R_c)/(r_e+R_e+R_b)$$

$$K=(R_b+R_c)/R_b$$

$$V=(R_b+R_c)I$$

$$V_b=V_{be}+I(R_e)$$

$$V_b=I R_b$$

Manipulating these equations:

$$V/I=R_b+R_c$$

$$V/I=K_T(r_e+R_e+R_b)$$

$$V_{be}/I=R_b-R_e$$

By substituting known values for V, I, and $V_{be}$ and $K_T$, a set of three independent linear equations with three unknowns may be solved for the resistance values.

For example, if $I_{Current\ Source}$ is set to 9 mA;

$$I=4.5\text{ mA.}$$

Additionally, selecting a temperature coefficient set point of:

$$TC=8\text{ mV/° C., for V=4.5 Volt;}$$

$$K_T=8/2.3=3.478.$$

Furthermore, since V=4.5 Volt:

$$Rb+Rc=V/I=4.5\text{ V}/4.5\text{ mA}=1\text{ k}$$

$$3.478=1k/(r_e+R_e+R_b)$$

$$3.478=1k/(26/4.5+R_e+R_b)$$

$$287.5=26/4.5+R_e+R_b$$

$$287.5=5.8+R_e+R_b$$

$$(650\text{ mV}+60\text{ mV}*\log_{10}(4.5))/4.5=R_b-R_e$$

$$R_e=R_b-153.1$$

By substituting these expressions:

$$287.5=5.8+2R_b-153.1$$

$$R_b=217.4$$

$R_e=217.4-153.1$ $R_e=64.3$ $R_c=1k-217.4$ $R_c=782.6$

In this example, the voltage provided by biasing stage 34 may be 4.5 volts, however, the resistance values may be chosen for other desirable voltage levels. For example, some FETs may require V=8.5 volts. To provide this bias signal, $R_c$ may be adjusted.

$8.5V=4.5\ mA*(Rc+217.4);$ $R_c=1671.5;$ and $K_T=(R_b+R_c)/(r_e+R_e+R_b)$ $K_T=1888.9/(5.8+64.3+217.4)$ $K_T=6.57$ $TC=15.1\ mV/°\ C.$ Thus, for these parameters, a temperature coefficient of 15.1 mV/° C. may be provided by incorporating resistor $R_e$ in biasing stage 44. This value may be comparable to the temperature coefficient of some FETs used in various types of operational amplifier output stages. For example, FETs such as VN0335 and VP0335 (i.e., NMOS and PMOS FETs), based on device parameters from Supertex Inc., may have temperature coefficients of:

$TC=(0.2*4V+0.16*4.5V)/100°\ C.=15.2\ mV/°\ C.$

Figure 9:
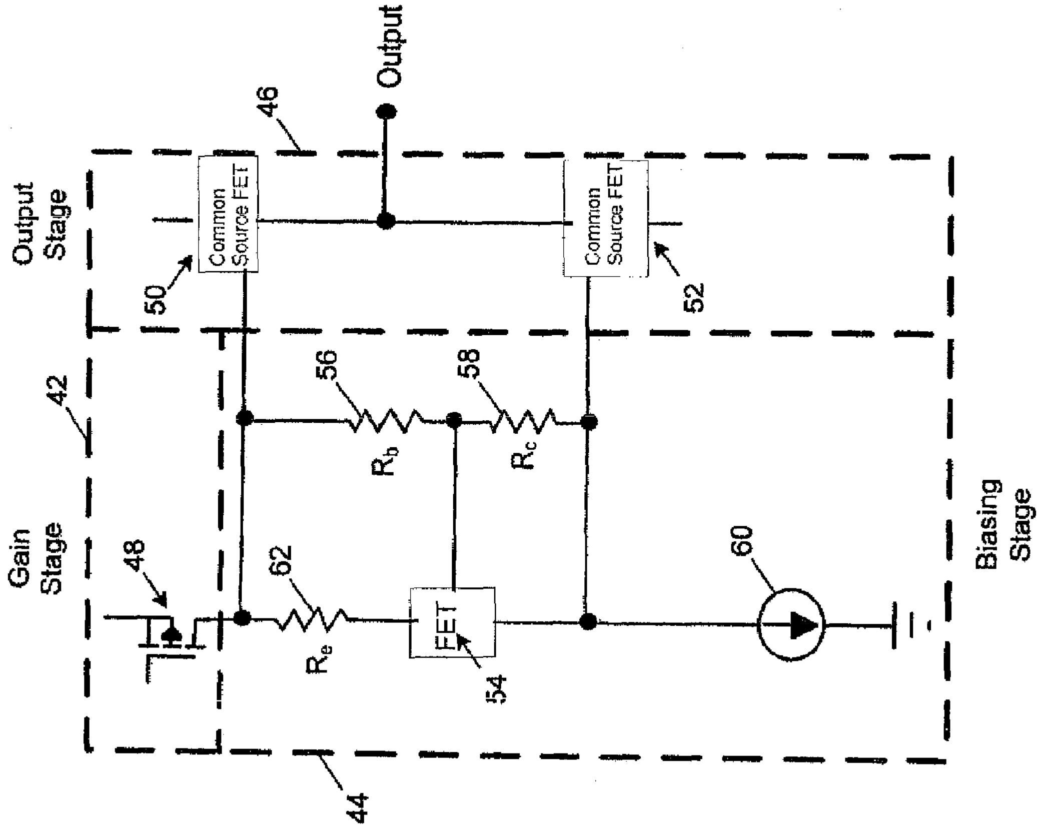
FIG. 9 is the circuit diagram of FIG. 4 including a field effect transistor in the biasing stage and a common source field effect transistor in the output stage.

Alternatively, the first transistor may include a field-effect transistor as shown in FIG. 9.

Figure 5:
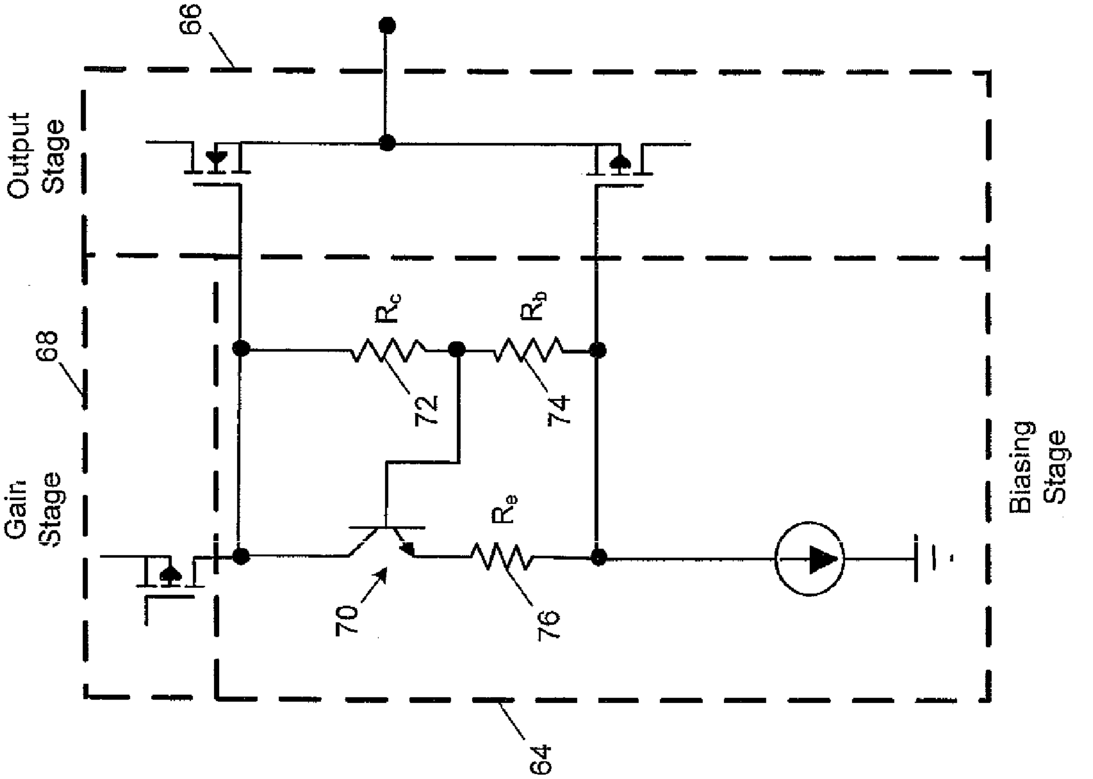
FIG. 5 is a circuit diagram of another biasing stage that may substantially match the temperature coefficient and threshold voltage of FETs includes in an output stage of an operational amplifier.

Referring to FIG. 5, another biasing stage may include an NPN type BJT transistor that may bias a pair of complementary MOSFETs included in an output stage. In particular, a biasing stage 64 is may bias an output stage 66 that may be driven by a gain stage 68. Similar to biasing stage 44 (shown in FIG. 4), a $V_{BE}$ multiplier included in biasing stage 64 may bias a pair of complementary MOSFETs in output stage 66. An NPN BJT 70 and a network of connected resistors may provide the biasing signals. In particular, a resistor 72 (labeled $R_c$) and resistor 74 (labeled $R_b$) may be respectively connected to the collector and base of NPN BJT 70 to provide a voltage divider. Similar to biasing stage 44, a resistor 76 (labeled $R_e$) may be connected to the emitter of NPN BJT 70 for substantially matching the temperature coefficient of the MOSFETs in output stage 66. An analytical method (similar to the analytical method described in conjunction with FIG. 4) may be used to determine the resistance values of $R_c$, $R_b$, and $R_e$. Once the resistances are determined, a biasing stage may be numerically modeled to simulate biasing signals that may be provided by the stage.

Figure 6:
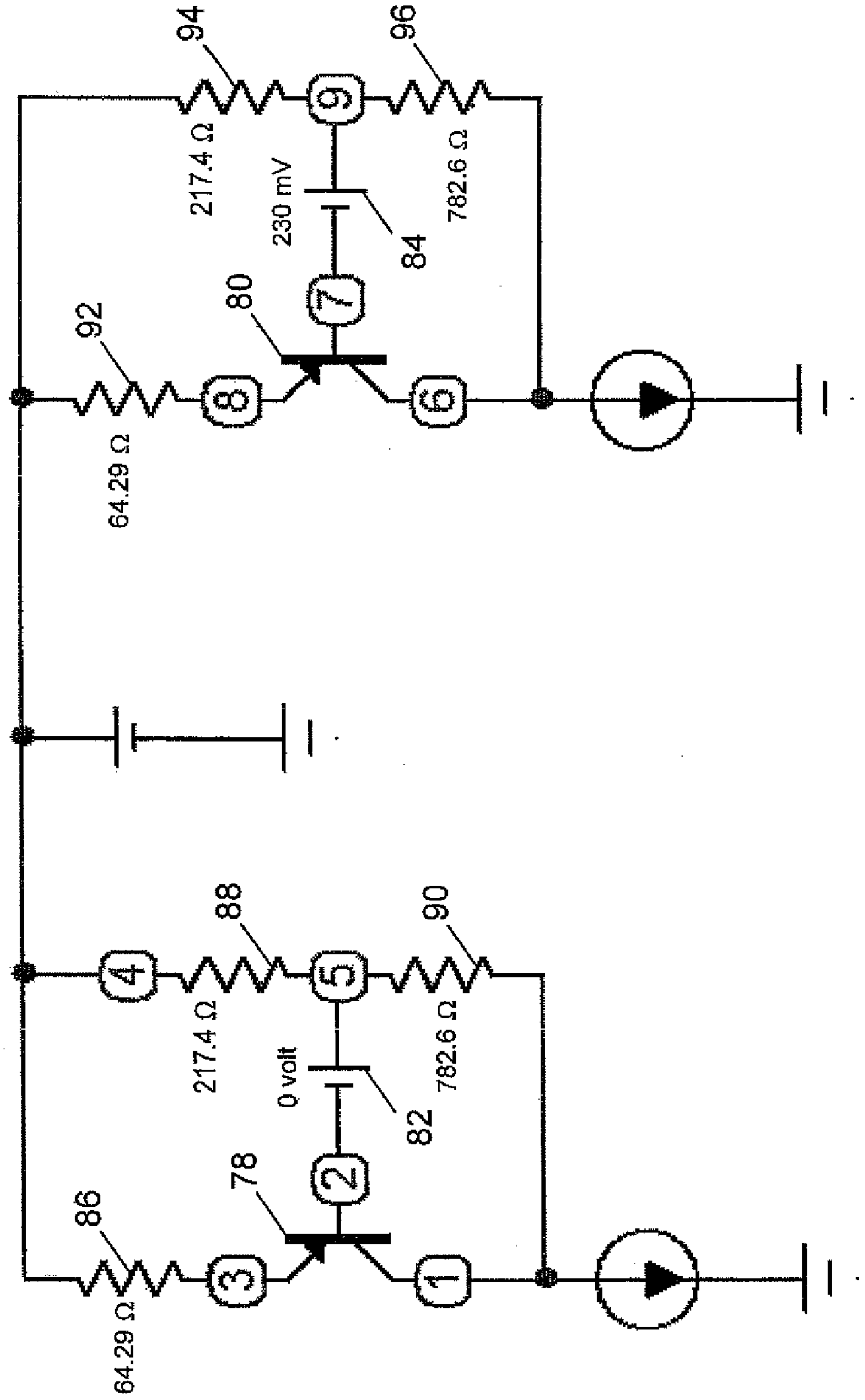
FIG. 6 is a circuit model that may simulate a biasing stage that may substantially match the temperature coefficient and threshold voltage of FETs includes in an output stage.
Figure 10:
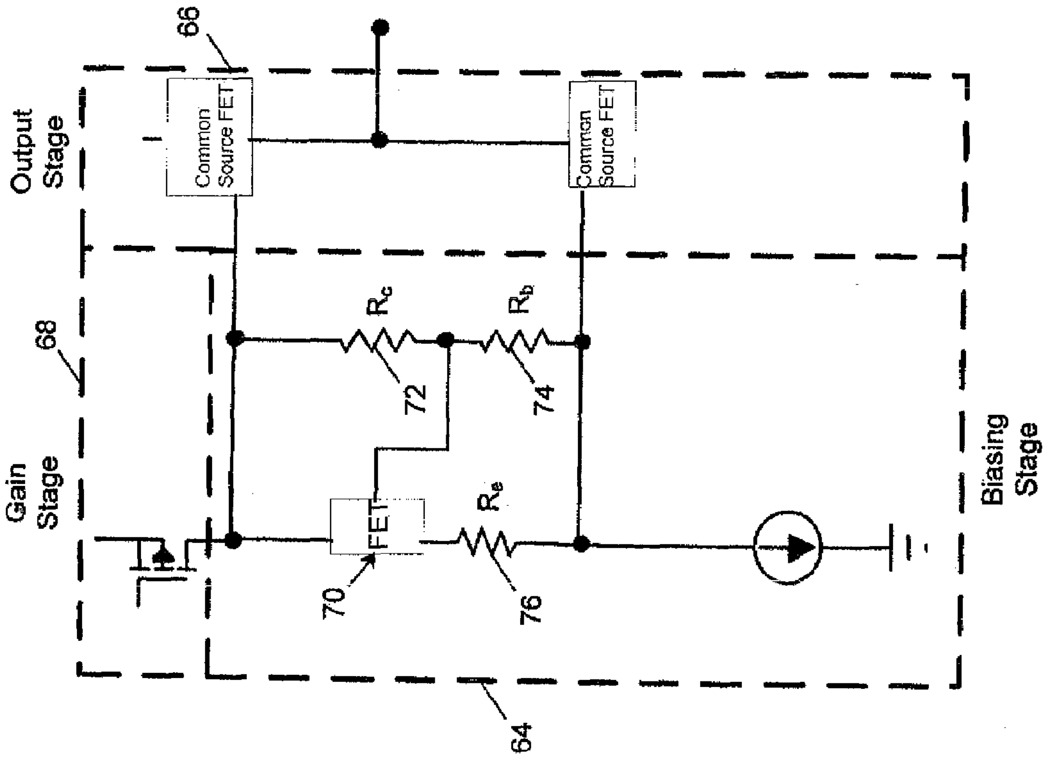
FIG. 10 is the circuit diagram of FIG. 5 including a field effect transistor in the biasing stage and a common source field effect transistor in the output stage.

Referring to FIG. 6, a schematic circuit model may be used in conjunction with the MicroCap computational circuit analysis software (produced by Spectrum Software of Sunnyvale, Calif.) for simulating a bias voltage signal that may substantially match a desired bias voltage of an output stage while substantially matching the temperature coefficient of the output stage. A pair of PNP BJT transistors 78 and 80 may be modeled to produce biasing signals at two simulated temperatures. To simulate the temperatures, voltage sources 82 and 84 may be respectively connected to the bases of transistors 78 and 80. To simulate a lower temperature, voltage source 82 provides zero volt, while to simulate a higher temperature, voltage source 84 provides 230 milli-volt. Resistors 86, 88, 90, 92, 94 and 96 may be connected to the respective bases, emitters, and collectors of transistors 78 and 80. Resistance values may be selected by using the analytical method mentioned above to provide a 4.5 volt bias signal. In particular, resistances for resistor pairs (i.e., resistors 86, 88 and resistors 92, 94) may be selected for substantially tracking the temperature coefficient of FETs included in an output stage. Additionally, resistances for resistors 90 and 96 may be selected to substantially match the bias voltage of the output stage FETs. In this demonstrative biasing circuit, resistances are selected to match a 4.5 volt bias voltage. Alternatively, the output stage may be configured as a common-source output stage as shown in FIG. 10.

Figure 7:
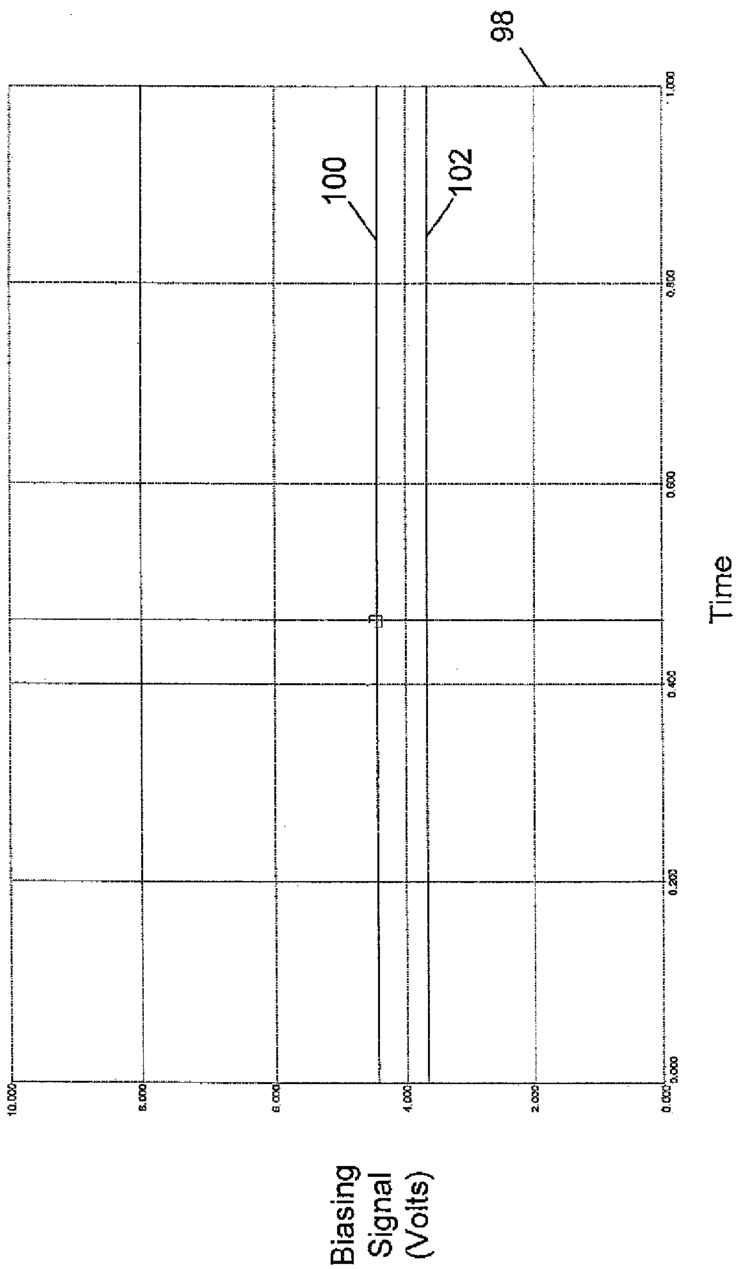
FIG. 7 is a chart that provides a simulated biasing voltage signal provided by the model shown in FIG. 5.

Referring to FIG. 7, a chart 98 presents the simulated biasing voltage signal that may be provided by the modeled biasing stage circuits shown in FIG. 6. The y-axis of chart 98 provides the output voltage of the circuits as a function of time (represented on the x-axis). Since the circuit component parameters may be substantially constant with time, the simulated output biasing voltage may also be constant. Trace 100 represents the biasing signal that may be provided by PNP BJT transistor 78 and resistors 86, 88 and 90. In particular, a voltage signal of approximately 4.459 volts may be provided by the $V_{BE}$ multiplier that may include transistor 78 that simulates a lower temperature environment with voltage source 82. Trace 102 represents the biasing signal that may be provided by transistor 80 in a higher simulated temperature environment (with voltage source 84). As reported by trace 102, a signal of approximately 3.666 volts may be provided for biasing an output stage. Thus, by selecting resistances appropriately, an appropriate biasing signal may be provided while substantially tracking the temperature.

Figure 8:
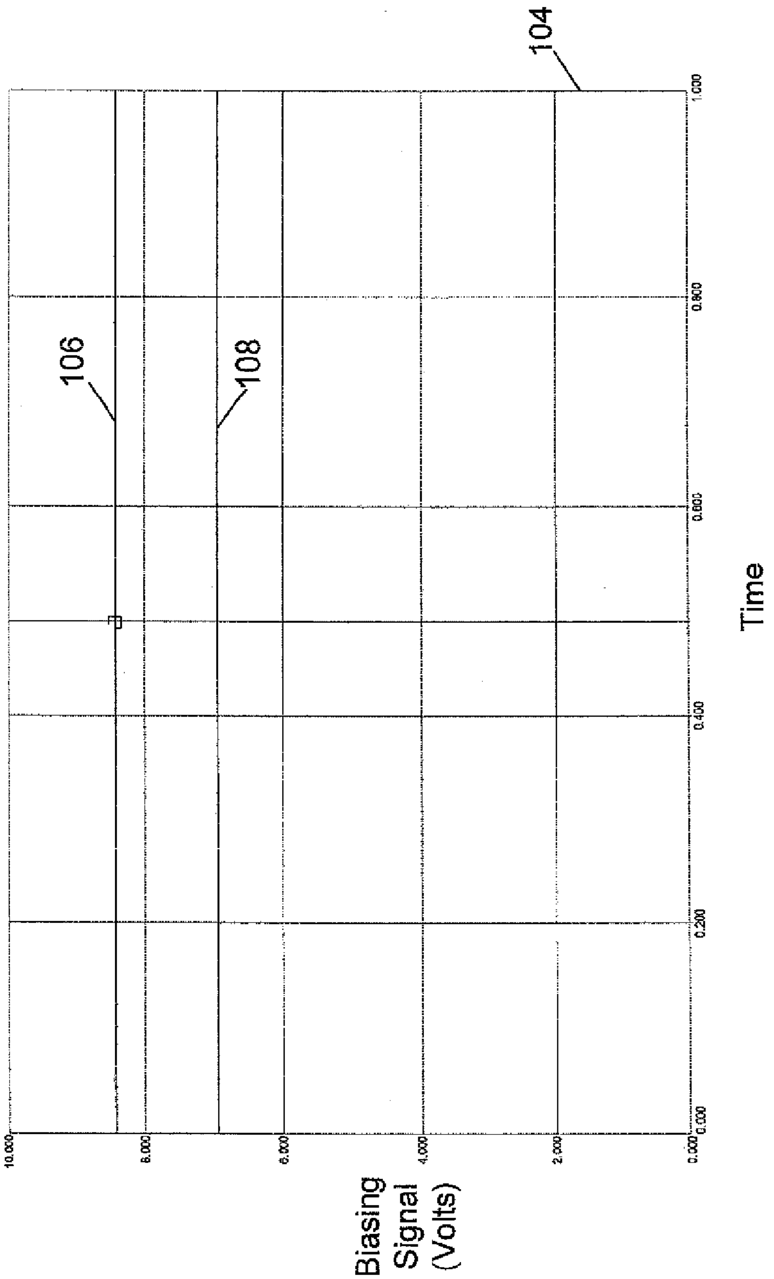
FIG. 8 is a chart that provides another simulated biasing voltage signal provided by the model shown in FIG. 5.

Referring to FIG. 8, a chart 104 presents a simulated biasing voltage signal versus time for the modeled biasing stage shown in FIG. 6 after being adjusted to substantially match another target bias voltage. In particular, resistances for the resistors in the two $V_{BE}$ multipliers may be selected based on the analytical method described above to provide an 8.5 volt biasing signal. Referring briefly to FIG. 6, to provide an 8.5 volt biasing signal the resistance values of resistors 86, 88, 92 and 94 may remain the same to track the temperatures simulated with voltage sources 82 and 84. To substantially match the target bias voltage, the resistance values of resistors 90 and 96 may be increased to 1671.5 Ω (from 782.6 Ω). Similar to FIG. 7, one trace 106 may represent the biasing signal produced by the $V_{BE}$ multiplier (that includes transistor 78) simulated at a lower temperature (due to voltage source 82). In this scenario, a biasing signal of 8.421 volts may be produced and represented by trace 106. Another trace 108 may represent the biasing signal produced the $V_{BE}$ multiplier (that includes transistor 80) simulated at a higher temperature (due to voltage source 84). At this higher temperature a biasing signal of 6.923 volts may be produced. Similar to adjusting the resistances to substantially track temperature and provide a biasing signal of approximately 4.5 volts, the resistors of the biasing stage may be adjusted to substantially track temperature and may provide a biasing signal of 8.5 volts. These biasing signals are understood to be exemplary, and the model circuit shown in FIG. 6 may be adjusted to simulate various other biasing signal levels.

By comparing the analytically produced biasing signals and the simulated biasing signals, an error measure may be determined. As shown in Table 1 below, calculated and simulated bias voltages are presented. In particular, bias voltages are provided for a lower target threshold voltage (i.e., 4.5 volts) and a higher target threshold voltage (i.e., 8.5 volts). As shown by the error measure, while tracking temperature changes, the simulated bias signal is approximately within 1% error of the calculated values.

TABLE 1

| | 25° C. low | 125° C. low | 25° C. high | 125° C. high |
|---|---|---|---|---|
| Calculated Result | 4.5 V | 3.7 V | 8.5 V | 6.99 V |
| Simulated Result | 4.459 V | 3.666 V | 8.421 | 6.923 V |
| Error | −0.92% | −0.93% | −0.94% | −0.97% |

The previous examples described using bipolar junction transistors in biasing stages as $V_{BE}$ multipliers for substantially matching the threshold voltage and temperature coefficient of FETs in an output stage. However, in some arrangements, a FET such as a MOSFET may be incorporated as a $V_{GS}$ multiplier in a biasing stage for substantially matching the threshold voltage and temperature coefficients of FETs in an output stage. In such an arrangement, resistive elements may be connected to the FET to substantially match the threshold voltage and temperature coefficients. Although, in some arrangements, resistive elements may be connected to one or more legs (e.g., the source) of the FET but not to each leg.

A number of implementations have been described. Nevertheless, it will be understood that various modifications may be made. Accordingly, other implementations are within the scope of the following claims.

What is claimed is:

1. An amplifier biasing stage, comprising: a first transistor configured to provide a temperature compensated biasing signal for a complementary pair of field-effect transistors included in an output stage of an amplifier; a first resistive element connected to an emitter of the first transistor; a second resistive element connected to a base of the first transistor; and a third resistive element connected to a collector of the first transistor, wherein the first, second and third resistors are coupled to complementary pair of field effect transistors and wherein the respective resistances of the first, second and third resistive elements are selected to substantially match a voltage provided by the amplifier biasing stage to a gate-to-source voltage of the complementary pair of field-effect transistors and to substantially match a temperature coefficient of the amplifier biasing stage to a temperature coefficient of the complimentary pair of field-effect transistors.

2. The amplifier biasing stage of claim 1, wherein the first transistor includes a bipolar junction transistor.

3. The amplifier biasing stage of claim 1, wherein the resistance of the first resistive element is based, at least in part, on a predefined temperature coefficient.

4. The amplifier biasing stage of claim 1, wherein the output stage is configured as a source-follower output stage.

5. The amplifier biasing stage of claim 1, wherein the output stage is configured as a common-source output stage.

6. The amplifier biasing stage of claim 1, wherein the output stage is configured as a class AB output stage.

7. The amplifier biasing stage of claim 1, wherein the first transistor includes an NPN bipolar junction transistor.

8. The amplifier biasing stage of claim 1, wherein the first transistor includes a PNP bipolar junction transistor.

9. An amplifier biasing stage, comprising: a first transistor configured to provide a temperature compensated biasing signal for a complementary pair of field-effect transistors included in an output stage of an amplifier; a first resistive element connected to a source of the first transistor; a second resistive element connected to a gate of the first transistor; and a third resistive element connected to a drain of the first transistor, wherein the first, second and third resistors are coupled to complementary pair of field effect transistors and wherein the respective resistances of the first, second and third resistive elements are selected to substantially match a voltage provided by the amplifier biasing stage to a gate-to-source voltage of the complementary pair of field-effect transistors and to substantially match a temperature coefficient of the amplifier biasing stage to a temperature coefficient of the complimentary pair of field-effect transistors.

10. The amplifier biasing stage of claim 9, wherein the first transistor includes a field-effect transistor.

11. The amplifier biasing stage of claim 9, wherein the first transistor includes a P-channel field-effect transistor.

12. The amplifier biasing stage of claim 9, wherein the first transistor includes an N-channel field-effect transistor.

13. An apparatus, comprising: an integrated circuit comprising: an amplifier comprising: an output stage configured to provide an amplified version of an input signal; a gain stage configured to drive the output stage; and a biasing stage configured to bias the output stage, wherein The biasing stage includes, a first transistor configured to provide a temperature compensated biasing signal for a complementary pair of field-effect transistors included in an output stage, a first resistive element connected to an emitter of the first transistor, a second resistive element connected to a base of The first transistor, and a third resistive element connected to a collector of the first transistor, wherein the first, second and third resistors are coupled to complementary pair of field effect transistors and wherein the respective resistances of the fast, second and third resistive elements arc selected to substantially match a voltage provided by the biasing stage to a gate-to-source voltage of the complementary pair of field-effect transistors and to substantially match a temperature coefficient of the biasing stage to a temperature coefficient of the complementary pair of field-effect transistors.

14. The amplifier of claim 13, wherein The first transistor includes a bipolar junction transistor.

15. The amplifier of claim 13, wherein the output stage is configured as a source-follower output stage.

16. The amplifier of claim 13, wherein the output stage is configured as a common-source output stage.

17. The amplifier of claim 13, wherein the output stage is configured as a class AB output stage.

18. A method, comprising: a temperature compensated biasing stage that includes a first transistor, biasing a complementary pair of field-effect transistors included in an output stage of an amplifier, wherein an emitter of the first transistor is connected to a first resistive element, a base of the first transistor is connected to a second resistive element, and a collector of the first transistor is connected to a third resistive element, wherein the first second and third resistors are coupled to complementary pair of field effect transistors and wherein the respective resistances of the first, second and third resistive elements are selected to substantially match a voltage provided by the biasing stage to a gate-to-source voltage of the complementary pair of field-effect transistors and to substantially match a temperature coefficient of the biasing stage to a temperature coefficient of the complimentary pair of field-effect transistors.

19. The method of claim 18, further comprising: driving the output stage with a gain stage.

* * * * *

UNITED STATES PATENT AND TRADEMARK OFFICE

CERTIFICATE OF CORRECTION

PATENT NO. : 7,619,476 B2
APPLICATION NO. : 11/378029
DATED : November 17, 2009
INVENTOR(S) : Harman It is certified that error appears in the above-identified patent and that said Letters Patent is hereby corrected as shown below:

Claim 13, Col. 12, line 24, "wherein The biasing" should be --wherein the biasing--.

Claim 13, Col. 12, line 29, "base of The first" should be --base of the first--.

Signed and Sealed this

Seventeenth Day of August, 2010

David J. Kappos
*Director of the United States Patent and Trademark Office*

UNITED STATES PATENT AND TRADEMARK OFFICE

CERTIFICATE OF CORRECTION

PATENT NO. : 7,619,476 B2
APPLICATION NO. : 11/378029
DATED : November 17, 2009
INVENTOR(S) : Jefferson H. Harman It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 527 days.

Signed and Sealed this

Twenty-sixth Day of October, 2010

David J. Kappos
*Director of the United States Patent and Trademark Office*